United States Patent
Kim et al.

(10) Patent No.: US 8,221,654 B2
(45) Date of Patent: Jul. 17, 2012

(54) EMI/RFI SHIELDING RESIN COMPOSITE MATERIAL AND MOLDED PRODUCT MADE USING THE SAME

(75) Inventors: Sung-Jun Kim, Uiwang-si (KR); Chang-Min Hong, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 252 days.

(21) Appl. No.: 12/634,768

(22) Filed: Dec. 10, 2009

(65) Prior Publication Data

US 2010/0140565 A1 Jun. 10, 2010

(30) Foreign Application Priority Data

Dec. 10, 2008 (KR) .................. 10-2008-0125407

(51) Int. Cl.
*H01B 1/22* (2006.01)
*G21F 1/02* (2006.01)

(52) U.S. Cl. .............. 252/519.5; 250/515.1; 439/607.02
(58) Field of Classification Search ............... 252/518.1, 252/519.5; 250/515.1; 439/607.02
See application file for complete search history.

(56) References Cited

U.S. PATENT DOCUMENTS

| | | | | |
|---|---|---|---|---|
| 4,533,685 | A | * | 8/1985 | Hudgin et al. ............ 523/457 |
| 5,141,982 | A | * | 8/1992 | Oku et al. ............ 524/432 |
| 5,171,480 | A | | 12/1992 | Yoshinaka et al. |
| 5,183,594 | A | * | 2/1993 | Yoshinaka et al. ...... 252/519.33 |
| 5,869,412 | A | | 2/1999 | Yenni, Jr. et al. |
| 6,409,942 | B1 | | 6/2002 | Narkis et al. |
| 6,573,322 | B1 | | 6/2003 | Sakakibara et al. |
| 6,638,448 | B2 | | 10/2003 | Karttunen et al. |
| 7,063,809 | B2 | | 6/2006 | Tabushi et al. |
| 2002/0108699 | A1 | | 8/2002 | Cofer et al. |
| 2006/0247352 | A1 | * | 11/2006 | Bormashenko et al. ...... 524/408 |
| 2007/0056769 | A1 | | 3/2007 | Severance et al. |
| 2007/0199738 | A1 | | 8/2007 | Gabower |

FOREIGN PATENT DOCUMENTS

| | | |
|---|---|---|
| CN | 1737222 | 2/2006 |
| EP | 0450609 A2 | 10/1991 |
| JP | 08-019257 | 8/1988 |
| JP | 09-241420 | 9/1997 |
| JP | 2000-129148 | 5/2000 |
| KR | 1992-0008576 | 1/1995 |
| WO | 03/054087 A2 | 7/2003 |

OTHER PUBLICATIONS

Caudle et al "Recent developments in radar absorbing paints and the zinc oxide tetrapod whisker", Microwave Comm., Antennas and Electronic Systems 2009 (IEEE COnf) Nov. 2009.*
Zhou et al "Studies on the strength and wear resistance of tetrapod shaped ZnO whisker-reinforced rubber composites", Jour. of App. Poly. Sci. 80(2001) 1520-1525.*
Zhou et al "Tetrapod-shaped ZnO whisker and its composites", Journ. Mat. Processing Tech. 89-90(1999) 415-418.*
Du et al "Synthesis of tetrapod-shaped ZnO whiskers and microrods . . . ", Trans. Nonferrous Met. Soc. China 18(2008) 155-161.*

* cited by examiner

*Primary Examiner* — Mark Kopec
(74) *Attorney, Agent, or Firm* — Summa, Additon & Ashe, P.A.

(57) ABSTRACT

Disclosed is an electromagnetic wave interference (EMI)/ radio frequency interference (RFI) shielding resin composite material including (A) a thermoplastic polymer resin, (B) a tetrapod whisker, and (C) a low melting point metal.

12 Claims, No Drawings

EMI/RFI SHIELDING RESIN COMPOSITE MATERIAL AND MOLDED PRODUCT MADE USING THE SAME

CROSS-REFERENCE TO RELATED APPLICATION

This application claims priority to and the benefit of Korean Patent Application No. 10-2008-0125407 filed in the Korean Intellectual Property Office on Dec. 10, 2008, the entire disclosure of which is incorporated herein by reference.

FIELD OF THE INVENTION

The present invention relates to an electromagnetic wave interference (EMI)/radio frequency interference (RFI) shielding resin composite material, and a molded product made using the same.

BACKGROUND OF THE INVENTION

Electromagnetic wave generation is increased through highly efficient, high power consuming, and highly integrated electro-electronic devices. Electromagnetic waves cause malfunctions to other devices and systems or damage to the human body, so effective electromagnetic wave shield techniques are required in order to shield the electromagnetic waves.

EMI shielding effectiveness is represented by the following Equation 1.

$$S. B. \text{ (shielding effectiveness)} = R + A + B \qquad \text{[Equation 1]}$$

In the above formula, R represents surface reflection of an electromagnetic wave, A represents internal absorption of an electromagnetic wave, and B represents loss by multi-reflection.

The conventional method of shielding electromagnetic waves includes an applied printing and plating method using a metallic material.

Since the metallic material has high conductivity (R value, impedance is low) and a high electromagnetic wave shield rate through the surface reflection of electromagnetic waves, it is possible for even a thin metal to effectively shield electromagnetic waves.

However, the printing and plating techniques, particularly the plating process, include complicated steps such as removing oils, etching, neutralizing, activating, accelerating, metal depositing, activating, first plating, second plating, third plating, and so on. Accordingly, these techniques have drawbacks such as high production costs and low productivity, particularly in view of recent demands for increased productivity.

In contrast, an electromagnetic wave shielding material using a polymer composite resin can be obtained by simply injecting a composite resin, so it is a very economical process with regard to production cost and productivity.

However, in the case of a composite material using the polymer composite resin, since the electrical conductivity is lower than that of a metallic material, it is important to improve the surface reflection and internal absorption among the factors shown in Equation 1. Accordingly, the resin composite material has the drawback of deteriorated or reduced electromagnetic wave shielding efficiency when it is too thin. In order to increase the electromagnetic wave shielding efficiency of a resin composite material, the surface impedance thereof is decreased (electrical conductivity is increased), the R value is increased, and internal electromagnetic wave scattering/absorption is further induced, so that the A value is increased to provide a highly effective electromagnetic wave shielding composite resin.

The following publications relate to shielding of electromagnetic waves coming from all electronic devices such as radio frequency interference (RFI): an electromagnetic wave shielding device including a polymer substrate coated with metal on its surface (U.S. Patent Application Publication No. 2007-0199738); an electromagnetic wave shielding material including a non-conductive polymer, a conductive polymer, and an electrical conductive metal powder (U.S. Patent Application Publication No. 2007-0056769); a method of manufacturing an electrical conductive immersed fiber by coating a conductive fiber with a compatibilizer such as an organic wetting agent, and compositing the same in a resin (U.S. Patent Application Publication No. 2002-0108699); an electrically conductive thermoplastic elastomer including a conductive filler of nickel plated with silver in a styrene-ethylene-butadiene-styrene copolymer (SEBS) based matrix material which is a non-conductive resin (U.S. Pat. No. 6,638,448); an electrically conductive composition in which a carbonaceous conductive filler is immersed in a blend of two polymer resins having different polarities and the carbonaceous conductive filler is disposed on one having the higher polarity (U.S. Pat. No. 6,409,942); and a thermoplastic electromagnetic wave shielding sheet including a sheet material or polymer carrier that is capable of becoming porous during a thermoforming process and including a low-melting point metal conductive filler (U.S. Pat. No. 5,869,412).

In addition, U.S. Pat. No. 5,183,594 discloses a conductive resin composite material including a tetrapod whisker, or including a powder, a flake, or a fiber together with the tetrapod whisker.

However, these materials do not satisfy the required electromagnetic wave shield effects.

SUMMARY OF THE INVENTION

An exemplary aspect of the present invention provides an electromagnetic wave interference (EMI)/radio frequency interference (RFI) shielding resin composite material having high electrical conductivity and excellent electromagnetic wave shield effects.

Another aspect of the present invention provides a molded product made using the EMI/RFI shielding resin composite material.

According to one aspect of the present invention, an EMI/RFI shielding resin composite material is provided that includes (A) a thermoplastic polymer resin, (B) a tetrapod whisker, and (C) a low-melting point metal.

The EMI/RFI shielding resin composite material includes about 40 to about 84 volume % of the thermoplastic polymer resin (A), about 5 to about 59 volume % of the tetrapod whisker (B), and about 1 to about 10 volume % of the low-melting point metal (C).

The tetrapod whisker (B) may be made of ZnO.

The tetrapod whisker (B) may have four feet and a body, the foot may have a length of about 2 to about 100 μm from end to end, and the body may have a size of about 0.15 to about 10 μm.

The tetrapod whisker (B) may be coated with a conductive material on its surface, and the conductive material may include silver, copper, aluminum, iron, palladium, tin oxide, indium oxide, silicon carbide, zirconium carbide, titanium carbide, graphite, nickel, or a combination thereof.

The low-melting point metal (C) may be a solid solution including at least two kinds of metal elements.

The low-melting point metal (C) may have a main component including tin, bismuth, lead, or a combination thereof, and a minor component including copper, aluminum, nickel, silver, germanium, indium, zinc, or a combination thereof, and it may have a lower solidus temperature than temperatures used in the process of making the EMI/RFI shielding resin composite material.

The EMI/RFI shielding resin composite material may further include (D) a glass fiber filler in an amount of about 50 parts by weight or less based on about 100 parts by weight of the EMI/RFI shielding resin composite material.

According to another aspect of the present invention, a molded product made using the EMI/RFI shielding resin composite material is provided.

Hereinafter, further embodiments of the present invention will be described in detail.

DETAILED DESCRIPTION OF THE INVENTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when specific definition is not provided, the term "electromagnetic wave interference (EMI)/radio frequency interference (RFI)" refers to "electromagnetic wave interference (EMI) or radio frequency interference (RFI)".

According to one embodiment, electromagnetic wave shielding effectiveness (S.B) represented by the following Equation 1 may be improved by decreasing impedance, that is, by improving conductivity.

$$S.B.=R+A+B \quad \text{[Equation 1]}$$

In the above Equation 1, R represents surface reflection of electromagnetic waves (electrical conductivity), A represents inner absorption of electromagnetic waves, and B represents loss through multi-reflection.

The EMI/RFI shielding resin composite material according to one embodiment of the present invention includes (A) a thermoplastic polymer resin, (B) a tetrapod whisker, and (C) a low-melting point metal. The EMI/RFI shielding resin composite material includes about 40 to about 84 volume % of the thermoplastic polymer resin (A), about 5 to about 59 volume % of the tetrapod whisker (B), and about 1 to about 10 volume % of the low-melting point metal (C).

The EMI/RFI shielding resin composite material according to one embodiment is prepared by mixing the components. The composite material has a structure including a matrix of the thermoplastic polymer resin, and the tetrapod whisker and low-melting point metal dispersed in the matrix to provide a network.

Exemplary components included in the EMI/RFI shielding resin composite material according to embodiments of the present invention will hereinafter be described in detail.

(A) Thermoplastic Polymer Resin

Exemplary thermoplastic polymer resins include without limitation polyamides; polyalkylene terephthalates such as polyethylene terephthalate, polybutylene terephthalate, and the like; polyacetals; polycarbonates; polyimides; polyphenylene oxides; polysulfones; polyphenylene sulfides; polyamide imides; polyether sulfones; liquid crystal polymers; polyetherketones; polyetherimides; polyolefins such as polyethylene, polypropylene, and the like; acrylonitrile-butadiene-styrene; polystyrenes; syndiotactic syndiotactic polystyrenes; and the like; and combinations and blends thereof.

In one embodiment, the thermoplastic polymer resin is a crystalline polymer resin such as polyethylene, polypropylene, polyethylene terephthalate, polybutylene terephthalate, syndiotactic polystyrene, polyetherketone, polyphenylene sulfide, and the like, and combinations thereof. When the EMI/RFI shielding resin composite material includes polyphenylene sulfide, for example, it is possible to simultaneously increase crystallization speed and crystallinity, decrease viscosity and absorption rate, and improve heat resistance.

The EMI/RFI shielding resin composite material may include the thermoplastic polymer resin in an amount of about 40 to about 84 volume %, and in another embodiment, about 60 to about 80 volume %, based on the total amount of EMI/RFI shielding resin composite material. When the EMI/RFI shielding resin composite material includes the thermoplastic polymer resin in an amount within this range, the process and the EMI shield efficiency can be improved.

(B) Tetrapod Whisker

The tetrapod whisker according to one embodiment is used for a filler, and can provide the benefit of easily providing an inter-filler network to effectively decrease the impedance. It is currently believed that the tetrapod whiskers may be uniformly distributed in the polymer matrix, regardless of the flow of the molded composition, and thus can be helpful for the formation of the network. In addition, the tetrapod whisker can easily induce the internal electromagnetic wave scattering of the EMI/RFI shielding resin composite material due to the four-directional complex shape, and simultaneously, can further effectively induce the internal electromagnetic wave scattering of EMI/RFI shielding resin composite material due to a partial wear and broken-cut of the feet. As a result, the internal absorption value (A value) of electromagnetic waves can be effectively increased.

The tetrapod whisker may be made of ZnO. The ZnO may be obtained by thermal evaporation of Zn powder.

In addition, the tetrapod whisker may be a whisker comprising four feet, each having a length ranging from about 2 to about 100 μm from end to end, and a body having a size of about 0.15 to about 10 μm. When the tetrapod whisker has feet and a body with sizes within these ranges, it can be more effective in providing an inter-whisker network. Specifically, when the foot length is about 10 to about 40 μm from end to end and simultaneously the foot aspect ratio is less than about 30, and in one embodiment, about 3 to about 30, and the body size is about 1 to about 10 μm, the tetrapod whisker may be more suitable for providing an inter-whisker network and a polymer fusion process.

The term aspect ratio refers to the ratio of the length/width of the tetrapod whisker foot. When the aspect ratio is about 30 or more, the network effect may be deteriorated since the foot of the tetrapod whisker can be easily broken.

The tetrapod whisker may be coated with a conductive material on its surface, and in that case, it can provide electrical conductivity.

Exemplary conductive materials include without limitation silver, copper, aluminum, iron, palladium, tin oxide, indium oxide, silicon carbide, zirconium carbide, titanium carbide, graphite, nickel, and the like, and combinations thereof.

The EMI/RFI shielding resin composite material may include the tetrapod whisker in an amount of about 5 to about 59 volume %, for example about 20 to about 40 volume %, based on the total amount of EMI/RFI shielding resin composite material. When the EMI/RFI shielding resin composite material includes the tetrapod whisker in an amount in this range, the inter-whisker network can be easily formed.

(C) Low-Melting Point Metal

The low-melting point metal according to one embodiment can maximize the inter-filler network. It can also easily form the inter-filler network together with the tetrapod whisker to effectively decrease the impedance, so as to further improve the electromagnetic wave shield efficiency.

The low-melting point metal is a solid solution including at least two kinds of metal elements, and includes a main component (i.e., a majority component comprising greater than 50%, for example at least about 75%, or at least about 85%, or at least about 90%, or higher, of the total weight percent of the low-melting point metal) and a minor component (i.e., a minority component comprising less than 50% of the total weight of the low-melting point metal). Exemplary main components include without limitation tin, bismuth, lead, and combinations thereof, and exemplary minor components include without limitation copper, aluminum, nickel, silver, germanium, indium, zinc, and combinations thereof. According to one embodiment, the main component includes tin for an environmentally-friendly material.

The low-melting point metal may have a solidus temperature (temperature at which solidification is completed) that is lower than temperatures used in the process of making the EMI/RFI shielding resin composite material. When the low-melting point metal has a solidus temperature that is lower than temperatures used to make the EMI/RFI shielding resin composite material by more than about 20° C., it can be beneficial for the process of manufacturing a composite material and forming an inter-filler network. In another embodiment, the low-melting point metal has a solidus temperature that is higher by more than about 100° C. than downstream processing temperatures, such as used in molding the composite material to form a final end product, which can provide the benefit of stability.

A more detailed description follows. In order for the low-melting point metal to form a network in the thermoplastic polymer resin while manufacturing the EMI/RFI shielding resin composite material, the solidus temperature and the liquidus temperature (temperature at which solidification begins) of the low-melting point metal that affect the dispersion have the following order: liquidus temperature>melting point of thermoplastic polymer resin>solidus temperature.

Such solidus temperature may be controlled by the amount ratio of the main component and the minor component of the low melting point metal. Thereby, it is possible to control the physical properties such as liquidus temperature and mechanical strength.

Specifically, when the conductive coating material of the tetrapod whisker is aluminum, the solid solution beneficially includes aluminum; similarly, when the conductive coating material is copper, the solid solution beneficially includes copper.

One method of controlling a solidus temperature of the low-melting point metal by adjusting the element amount of the main component and the minor component includes providing a solid solution with another metal. Non-limiting examples of the method include controlling the solidus temperature of tin/copper (97/3 weight ratio) to 227° C., or controlling the solidus temperature of tin/copper/silver (92/6/2 weight ratio) to 217° C.

The EMI/RFI shielding resin composite material may include the low-melting point metal in an amount of about 1 to about 10 volume %, and in another embodiment, about 2 to about 5 volume % based on the total amount of the EMI/RFI shielding resin composite material. When the EMI/RFI shielding resin composite material includes the low-melting point metal in an amount within this range, it can be possible to further enforce the network of the tetrapod whisker.

(D) Glass Fiber Filler

The glass fiber filler may be further included in the EMI/RFI shielding resin composite material to improve the strength according to one embodiment.

The glass fiber filler may have a diameter of about 8 to about 13 μm and a length of about 2 to about 5 mm, but is not limited thereto. When the glass fiber filler has a diameter and length within these ranges, it can benefit the enforcement effect and the process of making the composite material.

The EMI/RFI shielding resin composite material may include the glass fiber filler in an amount of about 50 parts by weight or lower, and in another embodiment, about 2 to about 50 parts by weight, based on about 100 parts by weight of the EMI/RFI shielding resin composite material.

When the EMI/RFI shielding resin composite material includes the glass fiber filler in an amount within this range, it can be possible to improve the strength of EMI/RFI shielding resin composite material.

(E) Other Additives

The EMI/RFI shielding resin composite material according to one embodiment may further include a variety of known additives, as required, such as an antioxidant, an ultraviolet (UV) absorber, a flame retardant, a lubricant, a dye and/or pigment, and so on, as long as they do not damage the effects of the invention. The skilled artisan will understand the types and amounts of additives and how to use additives in the present invention without undue experimentation. The EMI/RFI shielding resin composite material may include the additives in an amount of about 0 to about 60 parts by weight, and in another embodiment, about 1 to about 30 parts by weight, based on about 100 parts by weight of the EMI/RFI shielding resin composite material.

Another embodiment of the present invention provides a molded product made using the EMI/RFI shielding resin composite material. The molded product is applicable in fields requiring an EMI/RFI shield, and it is particularly applicable for a display device such as a TV and a PDP requiring an excellent EMI/RFI shield, and an electro-electronic device such as a computer, a mobile phone, and an office automation device.

EXAMPLES

The following examples illustrate the present invention in more detail. However, they are exemplary embodiments of the present invention and are not limiting. A person having ordinary skill in this art can sufficiently understand parts of the present invention that are not specifically described.

(A) Thermoplastic Polymer Resin

The thermoplastic polymer resin is polyphenylene sulfide (PPS). Ryton PR-35 manufactured by Chevron Phillips Chemical is used for the PPS resin, and it has a zero shear viscosity of 1000[P] measured at 315.5° C. under a nitrogen atmosphere.

(B) Tetrapod Whisker

The tetrapod whisker is made of ZnO obtained by thermal evaporation using Zn powder, and it has a foot length of 10 to 50 μm and a body diameter of 1 to 10 μm. In addition, the tetrapod whisker is coated with silver on its surface.

(C) Low-Melting Point Metal

A tin/copper/silver low-melting point metal having a main component of tin is used as the low-melting point metal. The mixing ratio of each element of the low-melting point metal is tin/copper/silver=92/6/2 wt %, the solidus temperature is 217° C., and the liquidus temperature is 375° C.

(D) Glass Fiber Filler

The glass fiber filler is ECS 03 T-717PL (manufactured by Nippon Electric Glass) having a diameter of 10 μm and a length of 3 mm, and coated with silanes on its surface to improve interface adherence with the thermoplastic polymer resin of PPS.

Using the components, an EMI/RFI shielding resin composite material is prepared in each composition of Examples 1 to 4 shown in the following Table 1 and Comparative Examples 1 to 4 shown in the following Table 2, in accordance with the process (temperature: 300° C.), and is pressed with a common twin screw extruder and an injector to provide a pellet. As shown in the following Table 1, if the amount of glass fiber filler is recalculated into parts by weight, it would be 6.4 parts by weight based on the total of 100 parts by weight of the EMI/RFI shielding resin composite material.

Using the obtained pellets, the specific volume resistance is measured in accordance with the ASTM D257 method, and the electromagnetic wave shield efficiency is measured in accordance with the ASTM D4935 method using a specimen having a thickness of 2.1T. The results are shown in the following Tables 1 and 2, respectively.

TABLE 1

| | Examples | | | |
|---|---|---|---|---|
| Volume % | 1 | 2 | 3 | 4 |
| PPS | 88 | 78 | 68 | 63 |
| silver-coated tetrapod whisker | 10 | 20 | 30 | 30 |
| Sn/Cu/Ag low-melting point metal | 2 | 2 | 2 | 2 |
| glass fiber filler | — | — | — | 5 |
| specific volume resistance [Ω/cm] | $3.0 \times 10^{-2}$ | $1.8 \times 10^{-2}$ | $6.6 \times 10^{-3}$ | $8.3 \times 10^{-3}$ |
| average shielding effect [dB] at 2.1 T | 26 | 35 | 45 | 40 |

TABLE 2

| | Comparative Examples | | | |
|---|---|---|---|---|
| Volume % | 1 | 2 | 3 | 4 |
| PPS | 78 | 78 | 78 | 78 |
| silver-coated tetrapod whisker | 22 | — | — | — |
| silver-coated whisker[1] | — | 22 | — | — |
| silver flake[2] | — | — | 22 | — |
| nickel powder[3] | — | — | — | 22 |
| specific volume resistance [Ω/cm] | $3.4 \times 10^{-2}$ | $9.8 \times 10^{-1}$ | $2.2 \times 10^{-2}$ | $5.8 \times 10^{2}$ |
| average shielding effect [dB] at 2.1 T | 28 | 15 | 22 | 5.5 |

[1] silver-coated potassium titanate whisker, which is a fiber-structured whisker having a diameter 0.3 to 0.6 μm and a length 10 to 20 μm
[2] silver flake having a diameter of 10 to 40 μm
[3] nickel powder of 5 to 30 μm From the results shown in Tables 1 and 2, Examples 2 to 4 including both the tetrapod whisker and the low-melting point metal have lower or comparative specific volume resistances than those of Comparative Examples 1 to 4, and an excellent shield effect. In addition, although Example 1 includes the tetrapod whisker and the low-melting point metal in smaller amounts than Comparative Example 1, it exhibits similar specific volume resistance and shield effects. Furthermore, comparing Example 2 including the tetrapod whisker and the low-melting point metal to Comparative Example 1 including only the tetrapod whisker in the same amount as the total amount of tetrapod whisker and low-melting point metal used in Example 2, Example 2 exhibits lower specific volume resistance than that of Comparative Example 1, and excellent shield efficiency.

Particularly, it is understood that an inter-filler network formed by using the tetrapod whisker and the low-melting point metal according to the examples is superior to that of only using the tetrapod whisker or that of only using the silver flake or the nickel powder according to the comparative examples. In addition, comparing Comparative Example 1 to Comparative Example 2 confirms that the tetrapod whisker is superior to the fiber whisker. Comparing Comparative Example 1 to Comparative Example 3 confirms that the inter-filler network provided by using the silver-coated tetrapod whisker is superior to that of using the silver flake. Particularly, the examples confirm that the low-melting point metal provides the whisker network with enforcement effects.

Many modifications and other embodiments of the invention will come to mind to one skilled in the art to which this invention pertains having the benefit of the teachings presented in the foregoing description. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. An electromagnetic wave interference (EMI)/radio frequency interference (RFI) shielding resin composite material, comprising:
   (A) about 40 to about 84 volume % of a thermoplastic polymer resin;
   (B) about 5 to about 59 volume % of a tetrapod whisker; and
   (C) about 1 to about 10 volume % of a low-melting point metal comprising a main component selected from the group consisting of tin, bismuth, lead, and combinations thereof, and a minor component selected from the group consisting of copper, aluminum, nickel, silver, germanium, indium, zinc, and combinations thereof.

2. The EMI/RFI shielding resin composite material of claim 1, wherein the tetrapod whisker (B) comprises ZnO.

3. The EMI/RFI shielding resin composite material of claim 1, wherein the tetrapod whisker (B) comprises four feet and a body,
   wherein each foot has a length of about 2 to about 100 μm from end to end, and the body has a size of about 0.15 to about 10 μm.

4. The EMI/RFI shielding resin composite material of claim 1, wherein the tetrapod whisker (B) is coated with a conductive material on its surface.

5. The EMI/RFI shielding resin composite material of claim 4, wherein the conductive material is selected from the group consisting of silver, copper, aluminum, iron, palladium, tin oxide, indium oxide, silicon carbide, zirconium carbide, titanium carbide, graphite, nickel, and combinations thereof.

6. The EMI/RFI shielding resin composite material of claim 1, wherein the low-melting point metal (C) is a solid solution comprising at least two kinds of metal elements.

7. The EMI/RFI shielding resin composite material DeletedTexts of claim 1, wherein the low-melting point metal (C)

has a lower solidus temperature than the temperature of the EMI/RFI shielding resin composite material process.

8. The EMI/RFI shielding resin composite material of claim 1, wherein the EMI/RFI shielding resin composite material further comprises (D) glass fiber filler in an amount of about 50 parts by weight or less based on about 100 parts by weight of the EMI/RFI shielding resin composite material.

9. A molded product made using the EMI/RFI shielding resin composite material of claim 1.

10. The EMI/RFI shielding resin composite material of claim 1, comprising:
   (A) about 60 to about 84 volume % of the thermoplastic polymer resin;
   (B) about 5 to about 30 volume % of the tetrapod whisker; and
   (C) about 1 to about 10 volume % of the low-melting point metal.

11. The EMI/RFI shielding resin composite material of claim 10, wherein the thermoplastic polymer resin is polyphenylene sulfide.

12. The EMI/RFI shielding resin composite material of claim 11, wherein the low-melting point metal is a tin/copper/silver low-melting point metal.

* * * * *

UNITED STATES PATENT AND TRADEMARK OFFICE
CERTIFICATE OF CORRECTION

| | | |
|---|---|---|
| PATENT NO. | : 8,221,654 B2 | Page 1 of 1 |
| APPLICATION NO. | : 12/634768 | |
| DATED | : July 17, 2012 | |
| INVENTOR(S) | : Sung-Jun Kim and Chang-Min Hong | |

It is certified that error appears in the above-identified patent and that said Letters Patent is hereby corrected as shown below:

In the Claims:

Columns 8 and 9, at Claim 7 reads:

7. The EMI/RFI shielding resin composite material ~~DeletedTexts~~ of claim 1, wherein the low-melting point metal (C) has a lower solidus temperature than the temperature of the EMI/RFI shielding resin composite material process.

and should read:

7. The EMI/RFI shielding resin composite material of claim 1, wherein the low-melting point metal (C) has a lower solidus temperature than the temperature of the EMI/RFI shielding resin composite material process.

Signed and Sealed this
Twenty-third Day of October, 2012

David J. Kappos
*Director of the United States Patent and Trademark Office*

UNITED STATES PATENT AND TRADEMARK OFFICE
CERTIFICATE OF CORRECTION

PATENT NO. : 8,221,654 B2  
APPLICATION NO. : 12/634768  
DATED : July 17, 2012  
INVENTOR(S) : Sung-Jun Kim and Chang-Min Hong Page 1 of 1

It is certified that error appears in the above-identified patent and that said Letters Patent is hereby corrected as shown below:

In the Claims:

Column 8 line 66 - Column 9, line 2, Claim 7:

7. The EMI/RFI shielding resin composite material ~~Deleted Texts~~ of claim 1, wherein the low-melting point metal (C) has a lower solidus temperature than the temperature of the EMI/RFI shielding resin composite material process.

should read:

7. The EMI/RFI shielding resin composite material of claim 1, wherein the low-melting point metal (C) has a lower solidus temperature than the temperature of the EMI/RFI shielding resin composite material process.

This certificate supersedes the Certificate of Correction issued October 23, 2012.

Signed and Sealed this  
Thirteenth Day of November, 2012

David J. Kappos  
*Director of the United States Patent and Trademark Office*